US012677518B2

(12) United States Patent
Kobayashi

(10) Patent No.: US 12,677,518 B2
(45) Date of Patent: Jul. 7, 2026

(54) SEMICONDUCTOR DEVICE, LIGHT EMITTING DEVICE, DISPLAY DEVICE, PHOTOELECTRIC CONVERSION DEVICE, ELECTRONIC APPARATUS, ILLUMINATION DEVICE, MOVING BODY, AND WEARABLE DEVICE

(71) Applicant: CANON KABUSHIKI KAISHA, Tokyo (JP)

(72) Inventor: Kengo Kobayashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 652 days.

(21) Appl. No.: 18/299,152

(22) Filed: Apr. 12, 2023

(65) Prior Publication Data

US 2023/0343915 A1     Oct. 26, 2023

(30) Foreign Application Priority Data

Apr. 26, 2022     (JP) ................................. 2022-072670

(51) Int. Cl.
*H01L 27/32*        (2006.01)
*H01L 27/12*        (2006.01)
            (Continued)

(52) U.S. Cl.
CPC ........ *H10H 20/857* (2025.01); *H10H 20/855* (2025.01)

(58) Field of Classification Search
CPC .... H10F 39/804; H10F 39/806; H10F 39/811; H04N 23/54; H04N 23/00; H04N 25/00;
            (Continued)

(56) References Cited

U.S. PATENT DOCUMENTS 6,492,699 B1 *  12/2002  Glenn ................... H10F 39/804
                                                           257/434
7,738,053 B2 *  6/2010   Kubota ................ G02B 6/0055
                                                           362/628
(Continued)

FOREIGN PATENT DOCUMENTS

JP        2005-038635 A      2/2005
JP        2005-338589 A      12/2005
            (Continued)

OTHER PUBLICATIONS

Feb. 24, 2026 Japanese Official Action in Japanese Patent Appln. No. 2022-072670.

*Primary Examiner* — Leonard Chang
*Assistant Examiner* — Tsz K Chiu
(74) *Attorney, Agent, or Firm* — Venable LLP

(57)        ABSTRACT

A semiconductor device including an element substrate having a first surface on which a terminal is arranged, a light transmissive substrate having a second surface that is coupled to the first surface via a coupling member, a wiring board having a third surface connected to the terminal, and a reinforcing member configured to reinforce bonding between the element substrate and the wiring board. The terminal is arranged along a first side of the first surface. A side surface of the light transmissive substrate includes a fourth surface arranged along the first side. A chamfered fifth surface is arranged between the second surface and the fourth surface. The coupling member contacts the fifth surface, and the reinforcing member contacts a sixth surface of the wiring board on an opposite side of the third surface, the peripheral region and the fourth surface.

23 Claims, 8 Drawing Sheets

(51) Int. Cl.

| | |
|---|---|
| *H01L 51/00* | (2006.01) |
| *H10H 20/855* | (2025.01) |
| *H10H 20/857* | (2025.01) |

(58) Field of Classification Search

CPC ........ H04N 2101/00; G02B 6/00; F21K 9/61;
H10H 20/857; H10H 20/855; H10K
59/131; H10K 59/80; H10K 59/82; H10K
59/127; H10K 59/8794; H01L 23/488;
H01L 23/562; H03H 9/0557; H03H
9/02574; H03H 9/0542; H03H 9/0561;
H03H 9/1014; H03H 9/105; H03H
9/1085; H03H 9/6406; H03H 9/0519;
H03H 9/1021; H03H 9/6409; H10W
90/00; H10W 90/724; H10W 72/20;
H10W 90/734; H10W 90/701; H10W
90/754; H10W 74/00; H10W 74/15;
H10W 72/884; H10W 70/65; H10W
72/07251; H10W 70/685; H10W 70/60;
H10W 72/073; H10W 72/90; H10W
72/952; H10W 74/117; H10W 72/9415;
H10W 70/635; H10W 72/5522; H10W
42/121; H10W 70/611; H10W 90/401;
H10W 72/072; H10W 72/252; H10W
90/722; H10W 72/00; H10W 72/923;
H10W 70/05; H10W 70/614; H10W
70/093; H10W 72/0198; H10W 72/241;
H10W 72/352; H10W 74/114; H10W
90/732; H10W 70/656; H10W 72/354;
H10W 72/29; H10W 74/012; H10W
72/07236; H10W 72/877; H10W 70/655;
H10W 72/856; H10W 40/255; H10W
40/778; H10W 72/5524; H10W 20/20;
H10W 42/20; H10W 72/30; H10W
72/5525; H10W 72/59; H10W 74/016;
H10W 74/111; H10W 90/736; H10W
99/00; H10W 70/682; H10W 70/688;
H10W 72/536; H10W 72/5363; H10W
72/944; H10W 72/9445; H10W 74/10;
H10W 40/10; H10W 70/69; H10W
72/075; H10W 72/244; H10W 72/251;
H10W 72/5449; H10W 72/942; H10W
90/756; H10W 40/22; H10W 90/291;
H10W 90/297; H10W 70/68; H10W
72/874; H10W 74/142; H10W 72/07232;
H10W 72/5473; H10W 72/922; H10W
72/932; H10W 74/014; H10W 74/129;
H10W 90/811; H10W 70/09; H10W
72/012; H10W 72/07336; H10W 72/242;
H10W 72/325; H10W 72/652; H10W
72/871; H10W 72/926; H10W 44/20;
H10W 70/681; H10W 72/07636; H10W
72/5445; H10W 74/01; H10W 74/131;
H10W 20/42; H10W 72/01; H10W
72/019; H10W 72/07554; H10W 72/646;
H10W 72/691; H10W 72/9413; H10W
76/40; H10W 90/763; H10W 90/794;
H10W 20/43; H10W 40/228; H10W
72/07233; H10W 72/07631; H10W
72/321; H10W 72/50; H10W 72/9223;
H10W 74/127; H10W 74/137; H10W
70/40; H10W 70/652; H10W 72/07352;
H10W 72/547; H10W 90/24; H10W
90/288; H10W 90/752; H10W 90/764;
H10W 20/0234; H10W 40/25; H10W
46/00; H10W 70/63; H10W 70/692;
H10W 70/698; H10W 72/0113; H10W
72/01204; H10W 72/074; H10W 72/701;
H10W 72/865; H10W 72/9226; H10W
74/121; H10W 80/327; H10W 90/20;
H10W 90/22; H10W 90/28; H10W
90/792; H10W 20/2134; H10W 44/501;
H10W 70/095; H10W 70/481; H10W
70/687; H10W 72/071; H10W 72/07338;
H10W 72/552; H10W 74/019; H10W
80/312; H10W 20/023; H10W 20/0242;
H10W 20/40; H10W 42/00; H10W
44/248; H10W 70/042; H10W 70/099;
H10W 70/479; H10W 70/6528; H10W
70/66; H10W 72/01223; H10W 72/01257;
H10W 72/0711; H10W 72/07141; H10W
72/07254; H10W 72/07331; H10W
72/5366; H10W 72/5453; H10W 72/851;
H10W 72/859; H10W 76/60; H10W
90/755; H10W 20/2125; H10W 42/273;
H10W 46/601; H10W 70/658; H10W
72/01225; H10W 72/07178; H10W
72/248; H10W 72/555; H10W 72/60;
H10W 72/941; H10W 74/147; H10W
76/15; H10W 76/47; H10W 80/00; H10W
90/293; H10W 90/753; H10W 20/435;
H10W 20/481; H10W 40/00; H10W
40/226; H10W 42/276; H10W 70/02;
H10W 70/654; H10W 70/666; H10W
72/01235; H10W 72/07131; H10W
72/07341; H10W 72/07354; H10W
72/07553; H10W 72/227; H10W 72/234;
H10W 72/247; H10W 72/322; H10W
72/334; H10W 72/347; H10W 72/531;
H10W 72/921; H10W 72/931; H10W
72/951; H10W 72/963; H10W 72/967;
H10W 20/01; H10W 20/49; H10W
40/251; H10W 40/47; H10W 42/271;
H10W 70/424; H10W 70/461; H10W
70/466; H10W 70/468; H10W 72/01331;
H10W 72/07231; H10W 72/07332;
H10W 72/07337; H10W 72/07353;
H10W 72/232; H10W 72/351; H10W
72/353; H10W 72/387; H10W 72/886;
H10W 74/47; H10W 76/12; H10W 90/10;
H10W 20/0245; H10W 20/0265; H10W
20/484; H10W 20/497; H10W 40/258;
H10W 40/60; H10W 42/60; H10W
46/301; H10W 46/503; H10W 70/041;
H10W 70/098; H10W 70/415; H10W
70/442; H10W 70/618; H10W 72/01251;
H10W 72/016; H10W 72/01936; H10W
72/01953; H10W 72/07211; H10W
72/07223; H10W 72/07227; H10W
72/07234; H10W 72/07252; H10W
72/07533; H10W 72/076; H10W 72/221;
H10W 72/222; H10W 72/255; H10W
72/261; H10W 72/263; H10W 72/267;
H10W 72/332; H10W 72/381; H10W
72/834; H10W 76/01; H10W 76/10;
H10W 80/743; H10W 90/26; H10W
90/726; H10W 90/767; H10W 90/796;
H10W 95/00; H10W 20/0698; H10W
20/48; H10W 40/037; H10W 40/231;
H10W 40/233; H10W 40/235; H10W

40/253; H10W 40/259; H10W 40/611;
H10W 40/70; H10W 44/206; H10W
44/223; H10W 44/234; H10W 46/103;
H10W 46/401; H10W 46/603; H10W
46/607; H10W 70/20; H10W 70/417;
H10W 70/427; H10W 70/435; H10W
70/457; H10W 70/464; H10W 70/465;
H10W 70/686; H10W 70/695; H10W
72/01215; H10W 72/01231; H10W
72/01255; H10W 72/01271; H10W
72/013; H10W 72/01361; H10W
72/01925; H10W 72/01931; H10W
72/01955; H10W 72/07173; H10W
72/07183; H10W 72/07204; H10W
72/07235; H10W 72/07253; H10W
72/07355; H10W 72/07523; H10W
72/07532; H10W 72/07632; H10W
72/07637; H10W 72/07641; H10W
72/07653; H10W 72/237; H10W 72/285;
H10W 72/324; H10W 72/5475; H10W
72/551; H10W 72/585; H10W 72/651;
H10W 72/655; H10W 72/823; H10W
72/853; H10W 72/879; H10W 72/889;
H10W 72/925; H10W 72/934; H10W
72/953; H10W 74/141; H10W 74/40;
H10W 74/43; H10W 76/157; H10W
76/17; H10W 76/42; H10W 80/301;
H10W 90/271; H10W 90/284; H10W
90/721; H10W 90/731; H10W 90/751;
H10W 90/766

See application file for complete search history.

(56) References Cited

U.S. PATENT DOCUMENTS

| | | | |
|---|---|---|---|
| 7,830,595 B2 | 11/2010 | Hinata | |
| 7,920,224 B2 | 4/2011 | Monden | |
| 9,082,678 B2 | 7/2015 | Yamazaki | |
| 9,406,725 B2 | 8/2016 | Yamazaki | |
| 10,032,833 B2 | 7/2018 | Yamazaki | |
| 10,374,028 B1 * | 8/2019 | Lim | H10K 59/131 |
| 10,516,007 B2 | 12/2019 | Yamazaki | |
| 10,811,630 B2 | 10/2020 | Kang | |
| 10,818,737 B2 | 10/2020 | Yamazaki | |
| 11,088,222 B2 | 8/2021 | Yamazaki | |
| 12,075,669 B2 | 8/2024 | Ukigaya | |
| 2007/0065091 A1 | 3/2007 | Hinata | |
| 2009/0103000 A1 | 4/2009 | Monden | |
| 2009/0283887 A1 | 11/2009 | Takayama | |
| 2010/0084694 A1 * | 4/2010 | Kim | H10F 39/026 |
| | | | 257/292 |
| 2014/0014960 A1 | 1/2014 | Yamazaki | |
| 2015/0311266 A1 | 10/2015 | Yamazaki | |
| 2016/0336380 A1 | 11/2016 | Yamazaki | |
| 2018/0342561 A1 | 11/2018 | Shunpei | |
| 2020/0058893 A1 | 2/2020 | Kang | |
| 2020/0083300 A1 | 3/2020 | Yamazaki | |
| 2020/0098691 A1 * | 3/2020 | Itotani | H01L 24/17 |
| 2020/0312920 A1 | 10/2020 | Yamazaki | |
| 2021/0151515 A1 | 5/2021 | Yamazaki | |
| 2022/0085135 A1 | 3/2022 | Ukigaya | |

FOREIGN PATENT DOCUMENTS

| | | | |
|---|---|---|---|
| JP | 2007-114737 A | 5/2007 |
| JP | 2009-116297 A | 5/2009 |
| JP | 2009-277950 A | 11/2009 |
| JP | 2012-111661 A | 6/2012 |
| JP | 2014-032960 A | 2/2014 |
| JP | 2014-216394 A | 11/2014 |
| JP | 2018-004948 A | 1/2018 |
| JP | 2020-160469 A | 10/2020 |
| JP | 2022-047608 A | 3/2022 |

* cited by examiner

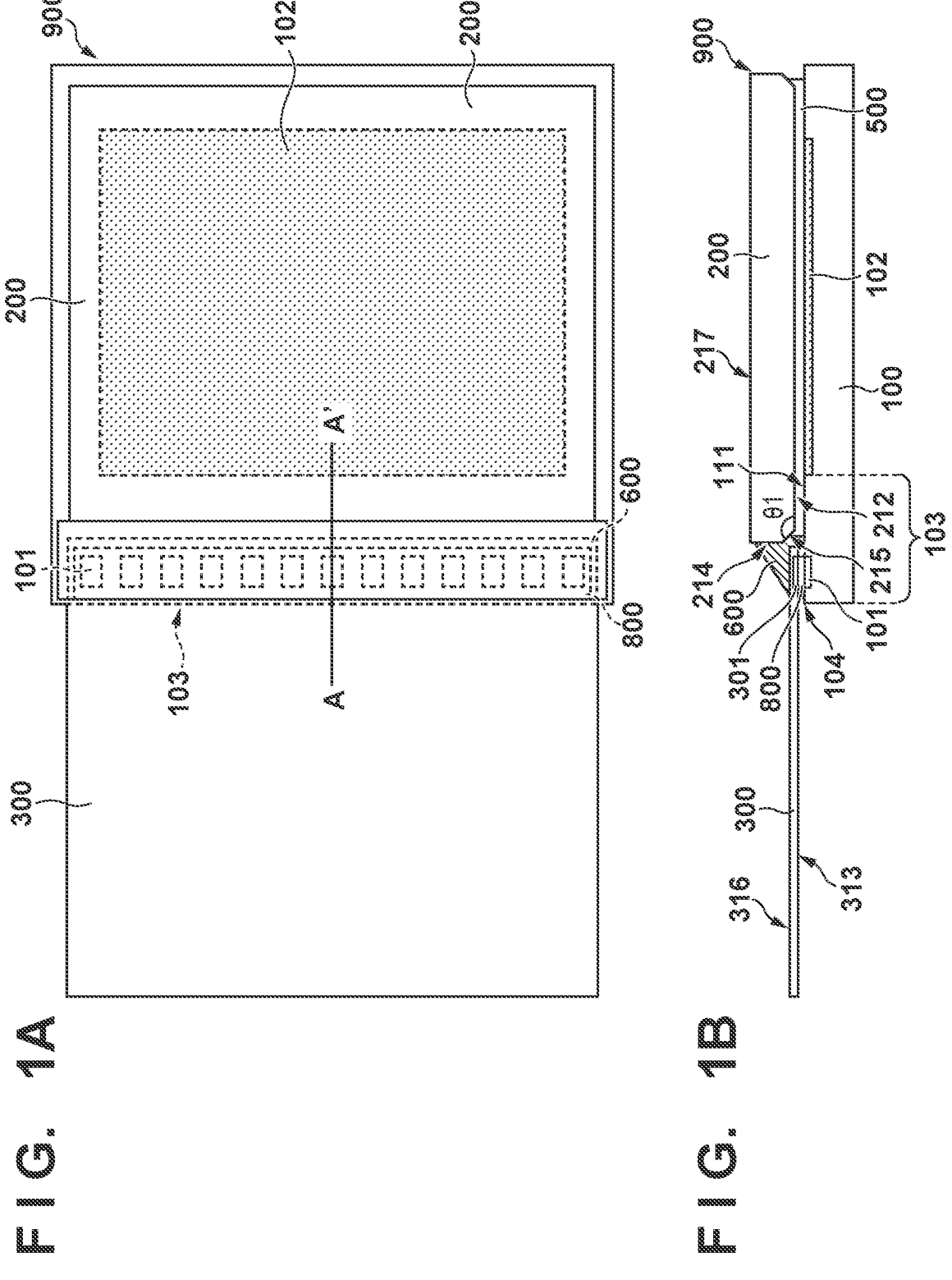
F I G.  1A
F I G.  1B

F I G. 5A
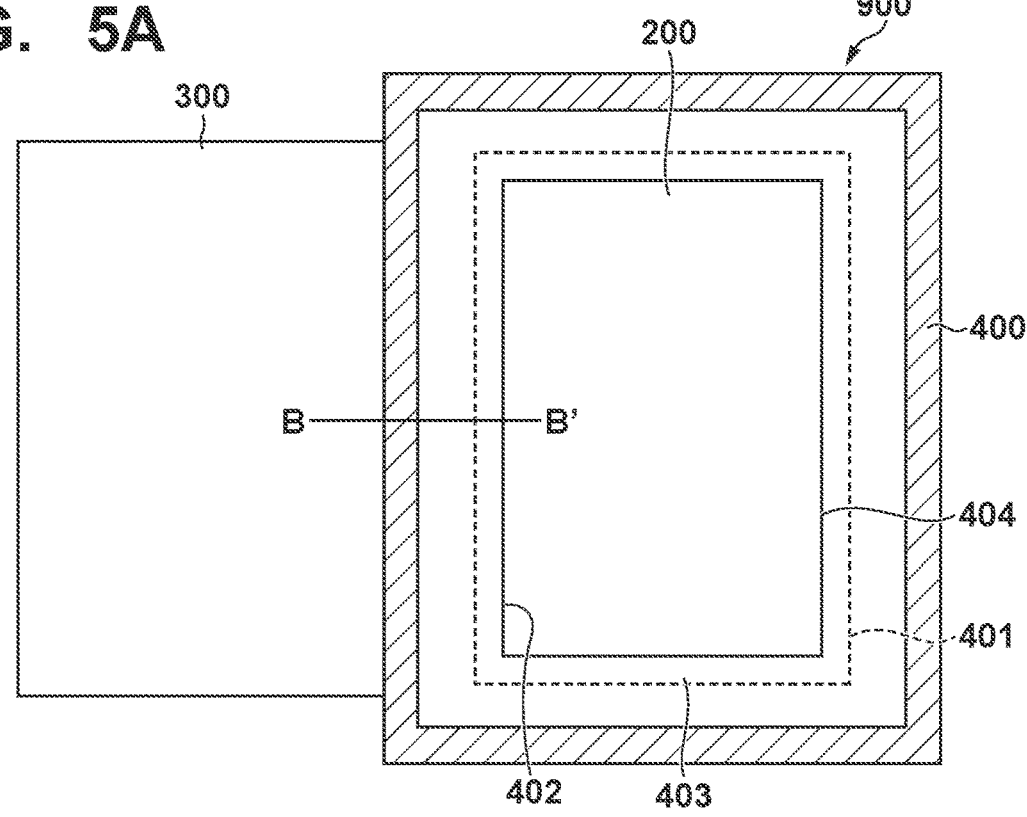
F I G. 5B
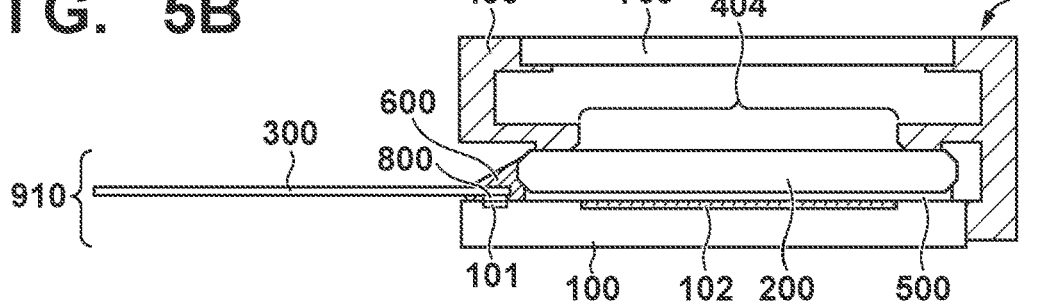
F I G. 5C
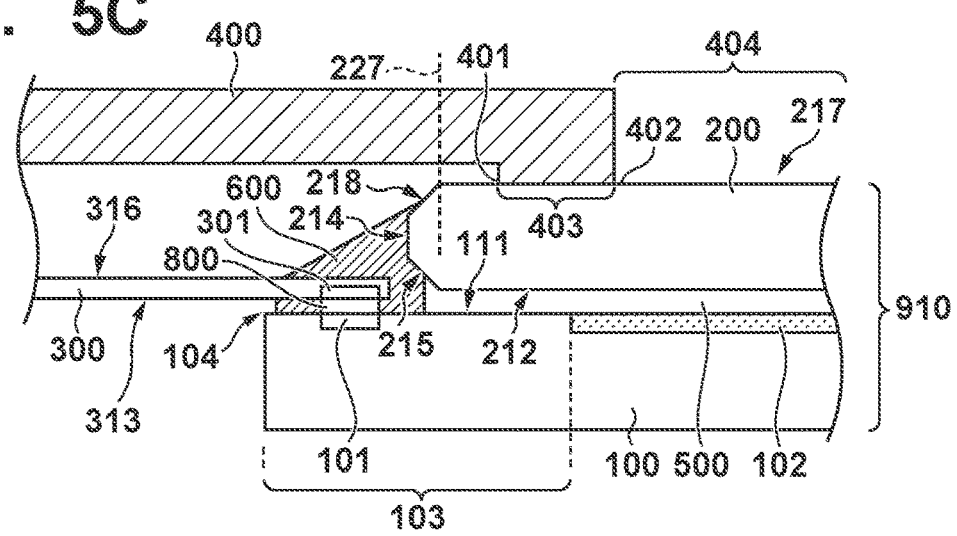

F I G. 6
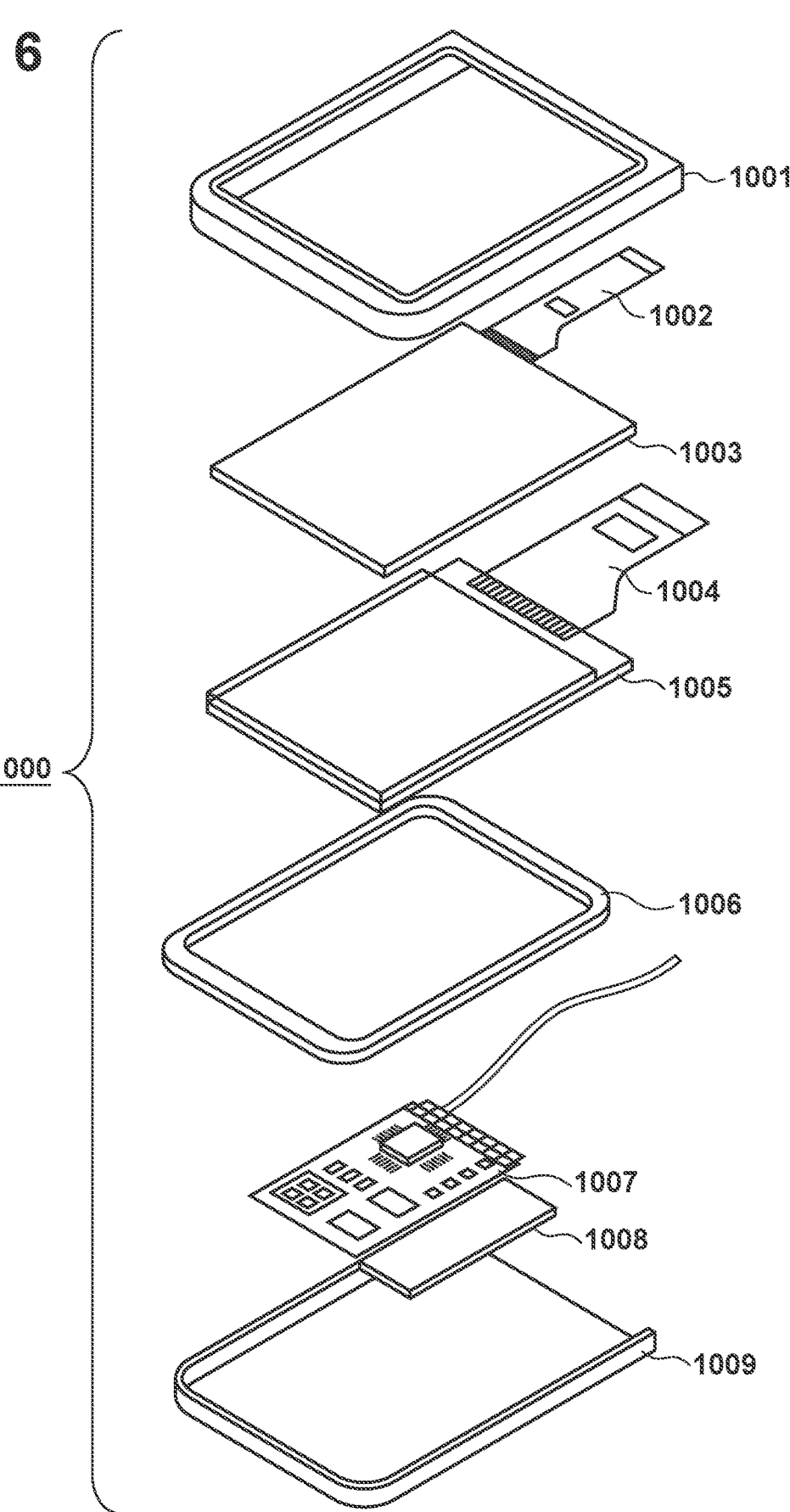

F I G. 7
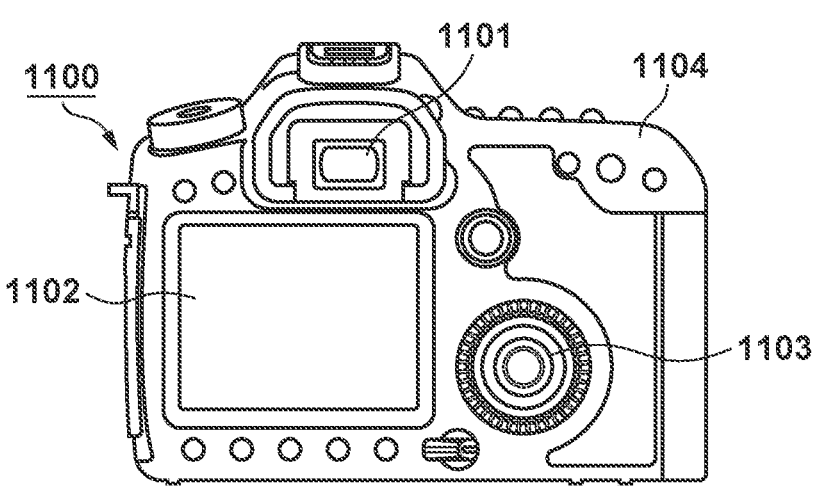
F I G. 8
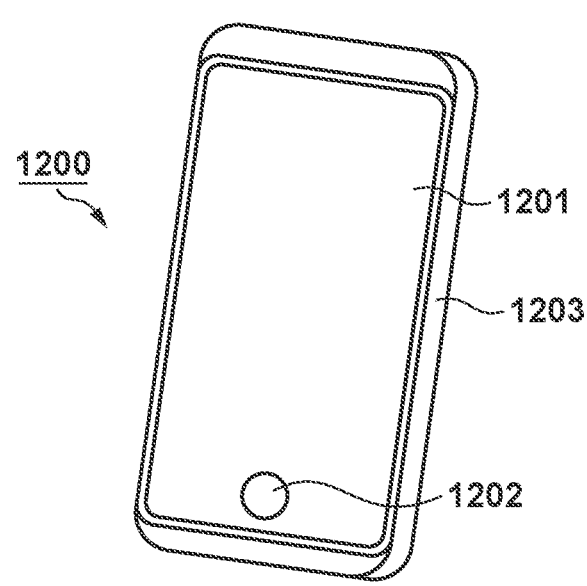

1300

1301  1302

1303

1310

1314

1311

1312

1313

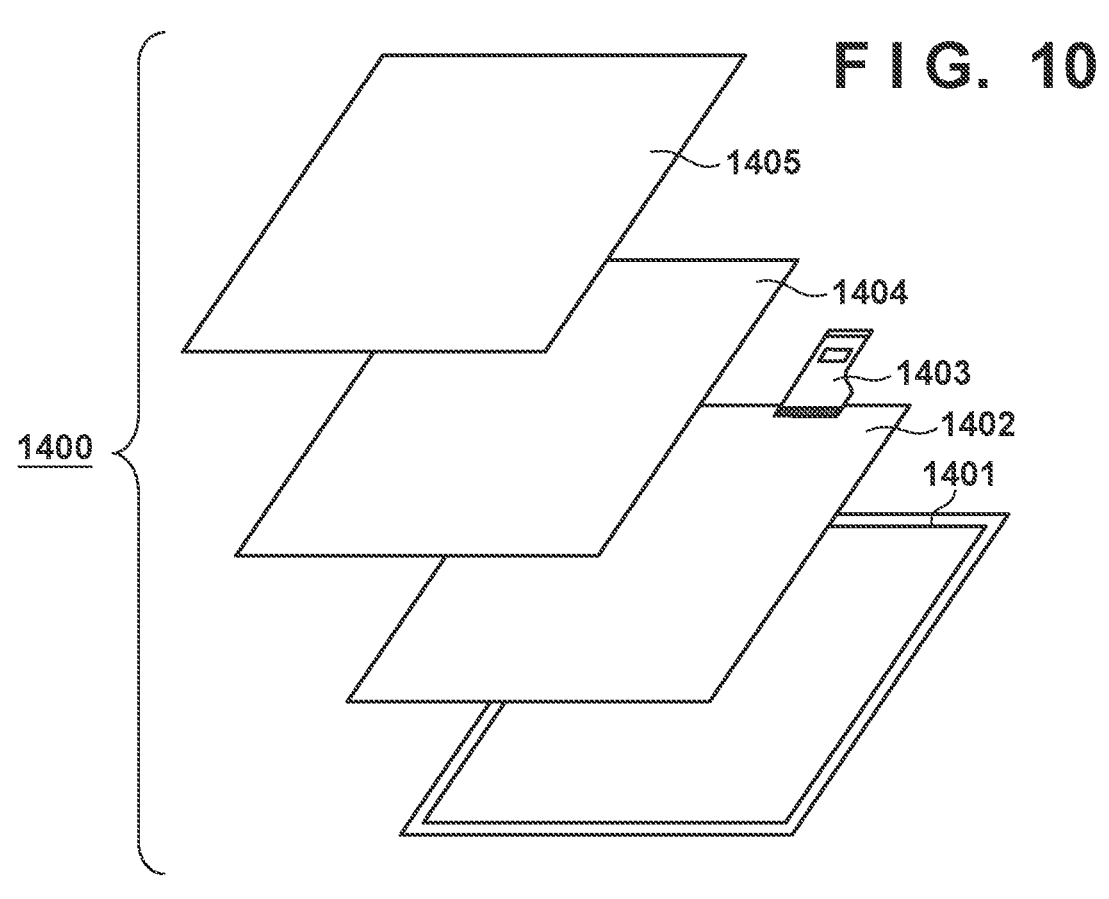
F I G. 10
1405
1404
1403
1402
1401
1400
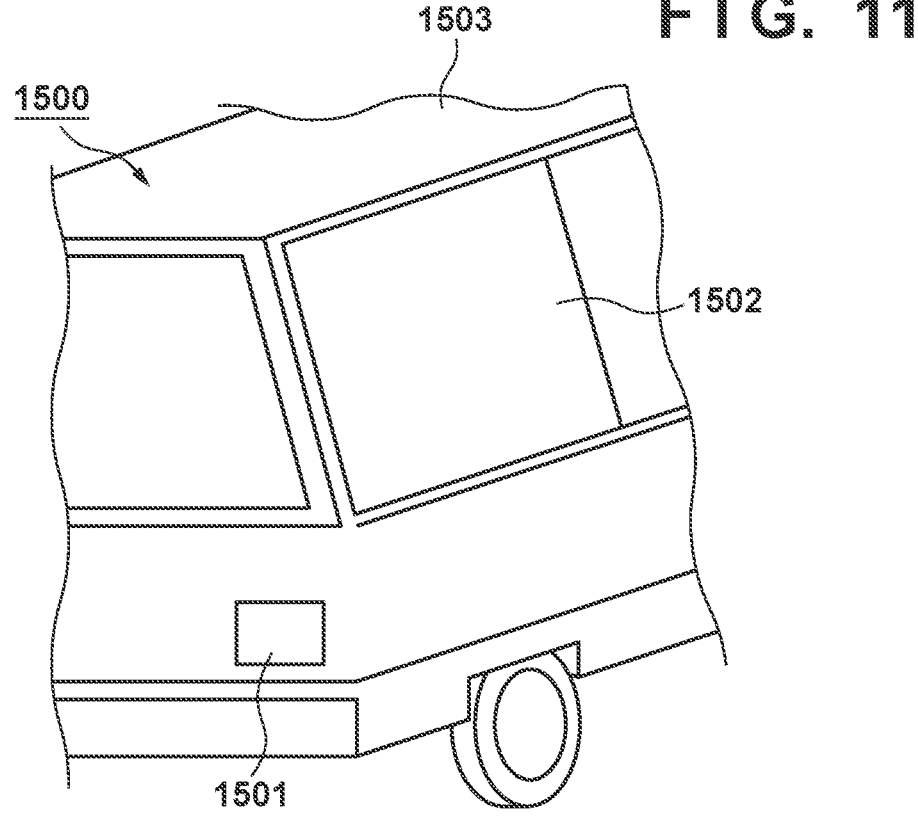
F I G. 11
1503
1500
1502
1501

F I G. 12A
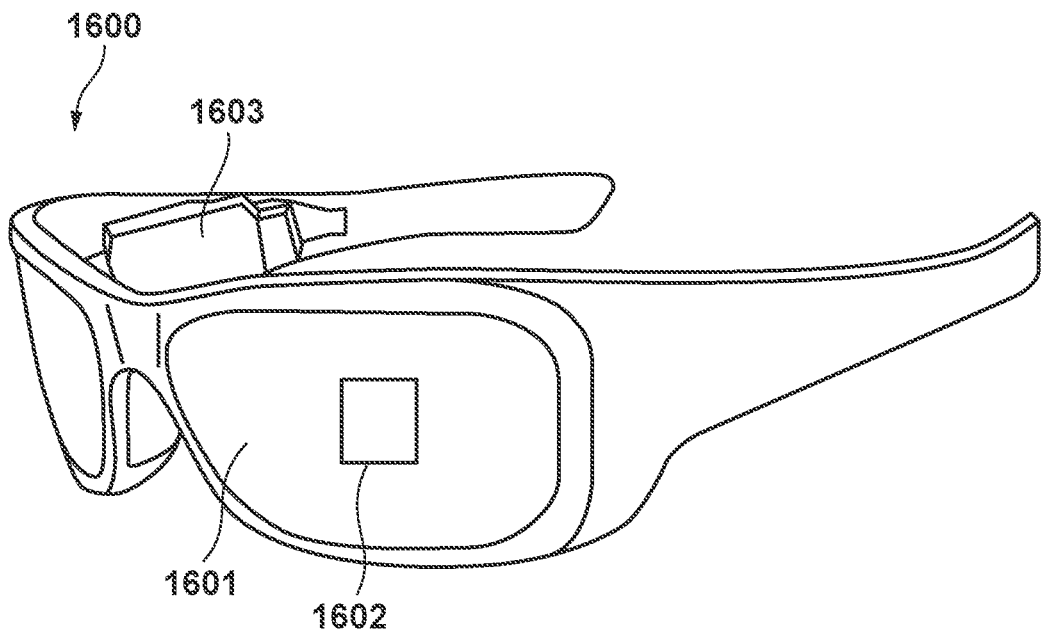
F I G. 12B
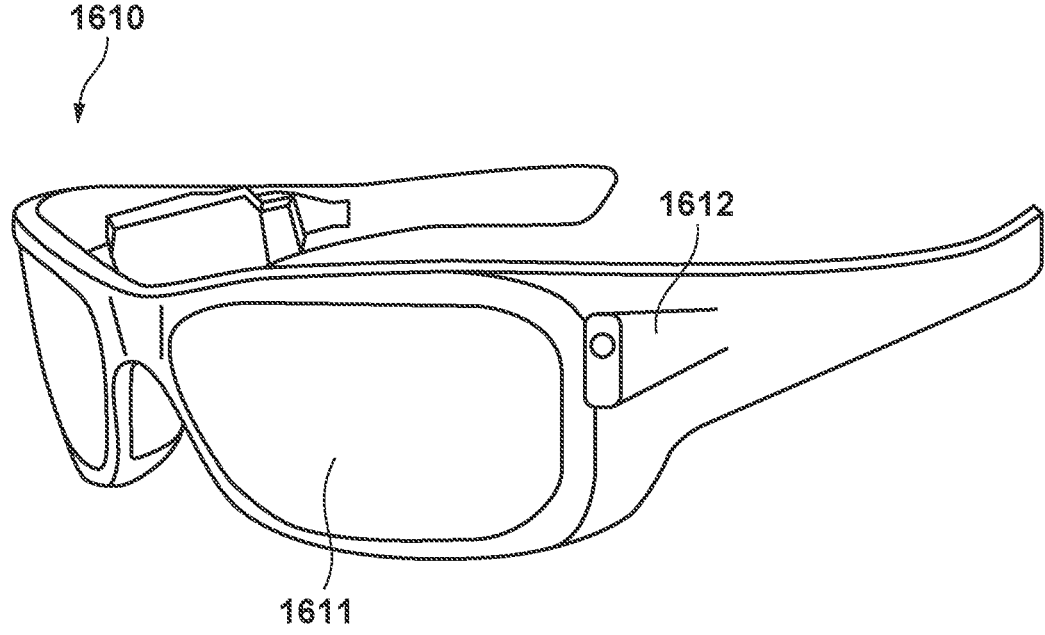

SEMICONDUCTOR DEVICE, LIGHT EMITTING DEVICE, DISPLAY DEVICE, PHOTOELECTRIC CONVERSION DEVICE, ELECTRONIC APPARATUS, ILLUMINATION DEVICE, MOVING BODY, AND WEARABLE DEVICE

BACKGROUND OF THE INVENTION

Field of the Invention

The present invention relates to a semiconductor device, a light emitting device, a display device, a photoelectric conversion device, an electronic apparatus, an illumination device, a moving body, and a wearable device.

Description of the Related Art

Japanese Patent Laid-Open No. 2009-277950 describes a semiconductor device including a semiconductor chip on which an optical element is formed, and a transparent member fixed on the semiconductor chip by a transparent adhesive so as to cover the optical element.

SUMMARY OF THE INVENTION

To reduce the size of a semiconductor chip, it is required to narrow a peripheral region provided on the outer edge side of an element region where an optical element region is arranged. If the peripheral region is narrowed, a bonding area between a terminal provided in the peripheral region and a wiring board on which an electrode connected to the terminal is arranged is reduced to decrease the bonding strength between the semiconductor chip and the wiring board, thereby degrading the reliability of a semiconductor device.

Some embodiments of the present invention provide a technique advantageous in improving the reliability of a semiconductor device.

According to some embodiments, there is provided a semiconductor device comprising (1) an element substrate having a first surface on which are provided (a) an element region where an optical element is arranged and (b) a peripheral region where an external connection terminal is arranged, (2) a light-transmissive substrate having a second surface that is coupled to the first surface via a coupling member so as to cover the element region, (3) a wiring board having a third surface on which an electrode connected to the external connection terminal is provided, and (4) a reinforcing member configured to reinforce bonding strength between the element substrate and the wiring board, wherein the external connection terminal is arranged along a first side of the first surface, a side surface, orthogonal to the second surface, of the light-transmissive substrate includes a fourth surface arranged along the first side, a fifth surface chamfered so that an angle with respect to the second surface becomes an obtuse angle is arranged between the second surface and the fourth surface, the coupling member contacts the fifth surface, and the reinforcing member contacts a sixth surface of the wiring board on an opposite side of the third surface, the peripheral region, and the fourth surface.

Further features of the present invention will become apparent from the following description of exemplary embodiments (with reference to the attached drawings).

BRIEF DESCRIPTION OF THE DRAWINGS

FIG. 1A is a plan view showing an example of the arrangement of a semiconductor device according to an embodiment;

FIG. 1B is a sectional view showing the example of the arrangement of the semiconductor device according to the embodiment;

FIG. 4 is a sectional view showing a modification of the semiconductor device shown in FIGS. 1A and 1B;

FIG. 5A is a plan view showing an example of the arrangement of the semiconductor device according to the embodiment;

FIGS. 5B and 5C are sectional views each showing the example of the arrangement of the semiconductor device according to the embodiment;

FIG. 6 is a view showing an example of a display device using the semiconductor device according to the embodiment;

FIG. 7 is a view showing an example of a photoelectric conversion device using the semiconductor device according to the embodiment;

FIG. 8 is a view showing an example of an electronic apparatus using the semiconductor device according to the embodiment;

FIG. 10 is a view showing an example of an illumination device using the semiconductor device according to the embodiment;

FIG. 11 is a view showing an example of a moving body using the semiconductor device according to the embodiment; and FIGS. 12A and 12B are views each showing an example of a wearable device using the semiconductor device according to the embodiment.

DESCRIPTION OF THE EMBODIMENTS

Figure 2:
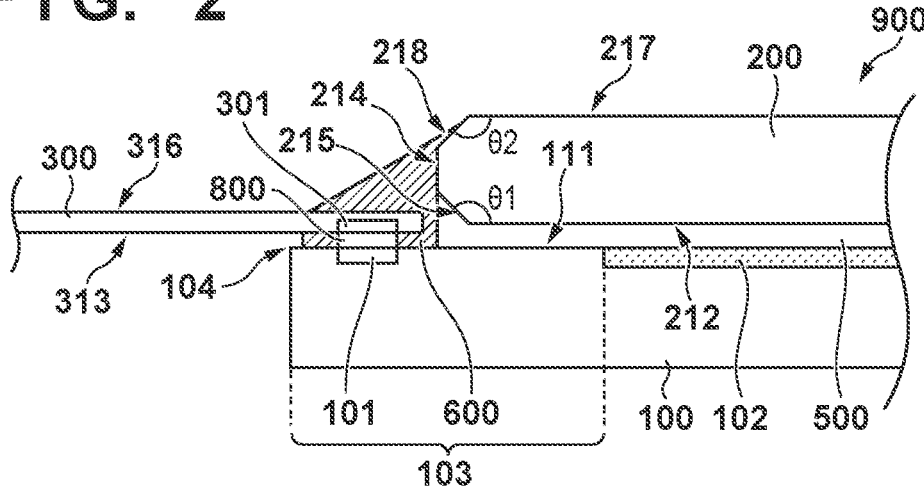
FIG. 2 is a sectional view showing a modification of the semiconductor device shown in FIGS. 1A and 1B.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

A semiconductor device according to an embodiment of the present disclosure will be described with reference to FIGS. 1A and 1B to 5A to 5C. FIG. 1A is a plan view showing an example of the arrangement of a semiconductor device 900 according to the embodiment. FIG. 1B is a sectional view taken along a line A-A' shown in FIG. 1A.

The semiconductor device 900 according to this embodiment includes an element substrate 100, a light-transmissive substrate 200, a wiring board 300, and a reinforcing member 600. The element substrate 100 has a surface 111 on which an element region 102 where an optical element is arranged and a peripheral region 103 where external connection terminals 101 are arranged are arranged. The surface 111 can also be called the main surface of the element substrate 100. As the element substrate 100, a semiconductor substrate such as silicon, or a glass substrate or a resin substrate in which a semiconductor layer is arranged can be used. The element region 102 where the optical element is arranged and the like are formed in the substrate. In the arrangement shown in FIGS. 1A and 1B, the external connection terminals 101 are arranged along a side 104 of the surface 111. However, the present invention is not limited to this, and the external connection terminals 101 may be arranged along another side. In this case, each of the components such as the light-transmissive substrate 200, the wiring board 300, and the reinforcing member 600 to be described below can similarly be arranged with respect to a side other than the side 104 of the surface 111 of the element substrate 100.

The light-transmissive substrate 200 is arranged to face the element substrate 100. A surface 212 of the light-transmissive substrate 200 is coupled to the surface 111 of the element substrate 100 via a coupling member 500 so as to cover the element region 102. The surface 212 can also be called the main surface of the light-transmissive substrate 200. As the light-transmissive substrate 200, a transmissive substrate made of glass or a resin can be used. A side surface, orthogonal to the surface 212, of the light-transmissive substrate 200 includes a surface 214 arranged along the side 104 of the element substrate 100. A surface 215 chamfered so that an angle with respect to the surface 212 becomes an obtuse angle θ1 is arranged between the surfaces 212 and 214 of the light-transmissive substrate 200. As shown in FIG. 1B, the outer edge of the surface 212 of the light-transmissive substrate 200 may be chamfered over the whole circumference.

If the outer edge of the surface 212 of the light-transmissive substrate 200 is chamfered, it is possible to prevent breaking of the ridgeline of the surface 212 of the light-transmissive substrate 200 caused by contact with a transfer collet or a transfer stage when transferring the light-transmissive substrate 200 in a manufacturing step of the semiconductor device 900 or the like. By chamfering, it is possible to suppress occurrence of a flaw in the element region 102 of the element substrate 100 when bonding the light-transmissive substrate 200 to the element substrate 100. As a result, it is possible to suppress a decrease in a yield in the manufacturing step of the semiconductor device 900. In FIG. 1B, the surface 215 of the light-transmissive substrate 200 is linear but may have a convex or concave shape.

If the optical element arranged in the element region 102 includes a photoelectric conversion element, the coupling member 500 that couples the element substrate 100 and the light-transmissive substrate 200 can be a resin member made of epoxy resin or acrylic resin that transmits light to which the photoelectric conversion element has sensitivity. If the optical element arranged in the element region 102 includes a light emitting element, the coupling member 500 can be a resin member made of epoxy resin or acrylic resin that transmits light emitted by the light emitting element. The coupling member 500 is arranged not to extend to the external connection terminals 101 of the element substrate 100, and contacts the surface 215 obtained by chamfering the surface 212 of the light-transmissive substrate 200. If the surface 215 obtained by chamfering the outer edge of the surface 212 of the light-transmissive substrate 200 is arranged, the coupling member 500 can be suppressed from extending from the outer edge of the light-transmissive substrate 200. This can decrease a region, in the peripheral region 103, where the coupling member 500 is assumed to extend, thereby reducing the size of the semiconductor device 900.

In the arrangement shown in FIG. 1B, the coupling member 500 contacts the entire surface in a portion where the surface 111 of the element substrate 100 and the surface 212 of the light-transmissive substrate 200 overlap each other. The present invention, however, is not limited to this. The arrangement of the coupling member 500 can appropriately be set as long as the element substrate 100 and the light-transmissive substrate 200 are coupled with necessary strength. For example, the element substrate 100 and the light-transmissive substrate 200 are coupled at only the four corners of the portion where the surface 111 of the element substrate 100 and the surface 212 of the light-transmissive substrate 200 overlap each other.

The wiring board 300 has a surface 313 on which electrodes 301 connected to the external connection terminals 101 of the element substrate 100 are provided. Each external connection terminal 101 of the element substrate 100 and each electrode 301 of the wiring board 300 are connected via a bonding member 800. The wiring board 300 can be, for example, a printed circuit board, and may be a board obtained by printing a wiring pattern on a rigid board such as a glass epoxy board or a composite board. For example, the wiring board 300 may be a flexible wiring board with a wiring pattern formed in a flexible film of polyimide or the like. Alternatively, the wiring board 300 may be a rigid flexible wiring board obtained by combining a flexible film and a rigid board. The wiring board 300 may supply electric power from the outside of the element substrate 100 to the element substrate 100. Furthermore, the wiring board 300 may input a signal from the outside of the element substrate 100 to the element substrate 100, and output a signal from the element substrate 100 to the outside of the element substrate 100.

The bonding member 800 that electrically connects the external connection terminal 101 of the element substrate 100 and the electrode 301 of the wiring board 300 can be a bump, an anisotropic conductive film, an anisotropic conductive paste, or the like. If a bump is used as the bonding member 800, the external connection terminal 101 and the electrode 301 are electrically bonded by ultrasound or heating and pressurizing. If an anisotropic conductive film or an anisotropic conductive paste is used as the bonding member 800, the external connection terminal 101 and the electrode 301 are electrically bonded by heating and pressurizing.

The reinforcing member 600 is arranged to reinforce the bonding strength between the element substrate 100 and the wiring board 300. The reinforcing member 600 may be an ultraviolet curing adhesive or thermosetting adhesive. To improve the bonding strength between the element substrate 100 and the wiring board 300, the reinforcing member 600 is arranged to contact a surface 316 of the wiring board 300, opposite to the surface 313 on which the electrodes 301 are arranged, the peripheral region 103 of the element substrate 100, and the surface 214 of the light-transmissive substrate 200. When the reinforcing member 600 contacts not only the element substrate 100 and the wiring board 300 but also the light-transmissive substrate 200, the bonding strength among the element substrate 100, the light-transmissive substrate 200, and the wiring board 300 is increased, thereby making it possible to improve the reliability of the semiconductor device 900.

In the arrangement shown in FIG. 1B, the coupling member 500 contacts part of the surface 215 of the light-transmissive substrate 200, and the reinforcing member 600 contacts a portion, not covered with the coupling member 500, of the surface 215 of the light-transmissive substrate 200. This can increase the bonding strength among the element substrate 100, the light-transmissive substrate 200, and the wiring board 300. At this time, as shown in FIG. 1B, the reinforcing member 600 may contact the coupling member 500. As shown in FIG. 1B, the reinforcing member 600 may contact the bonding member 800. When the reinforcing member 600 continuously covers the wiring board 300, the bonding member 800, the element substrate 100, the coupling member 500, and the light-transmissive substrate 200, the bonding strength among the element substrate 100, the light-transmissive substrate 200, and the wiring board 300 can be increased. However, the present invention is not limited to this, and the reinforcing member 600 need not contact the coupling member 500 or the bonding member 800. In the arrangement shown in FIGS. 1A and 1B, the reinforcing member 600 is arranged only on the side 104, connected to the wiring board 300, of the element substrate 100, but may be arranged on another side as long as it does not extend to the outer periphery of the element substrate 100.

As described above, the reinforcing member 600 for reinforcing the bonding strength between the element substrate 100 and the wiring board 300 contacts the surface 214 as a side surface of the light-transmissive substrate 200. Furthermore, as described above, the reinforcing member 600 also contacts a portion, not covered with the coupling member 500, of the surface 215 of the light-transmissive substrate 200. Thus, even if the peripheral region 103 of the element substrate 100 is narrowed and the bonding area between the element substrate 100 and the wiring board 300 is reduced, it is possible to increase the bonding strength among the element substrate 100, the light-transmissive substrate 200, and the wiring board 300. That is, it is possible to reduce the size of the semiconductor device 900 and obtain high reliability of the semiconductor device 900 at the same time.

A modification of the sectional view of the semiconductor device 900 shown in FIG. 1B will be described next with reference to FIG. 2. A description of the same components as those of the semiconductor device 900, which have been described with reference to FIGS. 1A and 1B, will appropriately be omitted.

In an arrangement shown in FIG. 2, the light-transmissive substrate 200 includes a surface 217 on the opposite side of the surface 212 facing the element substrate 100, and a surface 218 chamfered so that an angle with respect to the surface 217 becomes an obtuse angle θ2 is arranged between the surfaces 214 and 217. The outer edge of the surface 217 of the light-transmissive substrate 200 may be chamfered over the whole circumference. At this time, the reinforcing member 600 further contacts the surface 218 of the light-transmissive substrate 200. In the arrangement shown in FIG. 2, the coupling member 500 covers the entire surface 215 of the light-transmissive substrate 200. In the above-described arrangement shown in FIG. 1B as well, the coupling member 500 may cover the entire surface 215 of the light-transmissive substrate 200.

If the outer edge of the surface 217 of the light-transmissive substrate 200 is chamfered, it is possible to prevent breaking of the ridgeline of the surface 212 of the light-transmissive substrate 200 caused by contact with a transfer collet or a transfer stage when transferring the light-transmissive substrate 200 in the manufacturing step of the semiconductor device 900 or the like. This can suppress a decrease in a yield in the manufacturing step of the semiconductor device 900 such as occurrence of particles caused by breaking of the light-transmissive substrate 200.

In addition, the reinforcing member 600 contacts the surface 218 of the light-transmissive substrate 200. Thus, even if the peripheral region 103 of the element substrate 100 is narrowed and the bonding area between the element substrate 100 and the wiring board 300 is reduced, it is possible to increase the bonding strength among the element substrate 100, the light-transmissive substrate 200, and the wiring board 300. That is, it is possible to reduce the size of the semiconductor device 900 and obtain high reliability of the semiconductor device 900 at the same time.

In the arrangement shown in FIG. 2, the reinforcing member 600 contacts each of the coupling member 500 and the bonding member 800. When the reinforcing member 600 continuously covers the wiring board 300, the bonding member 800, the element substrate 100, the coupling member 500, and the light-transmissive substrate 200, the bonding strength among the element substrate 100, the light-transmissive substrate 200, and the wiring board 300 can be increased. However, the present invention is not limited to this, and the reinforcing member 600 need not contact the coupling member 500 or the bonding member 800.

Figure 3:
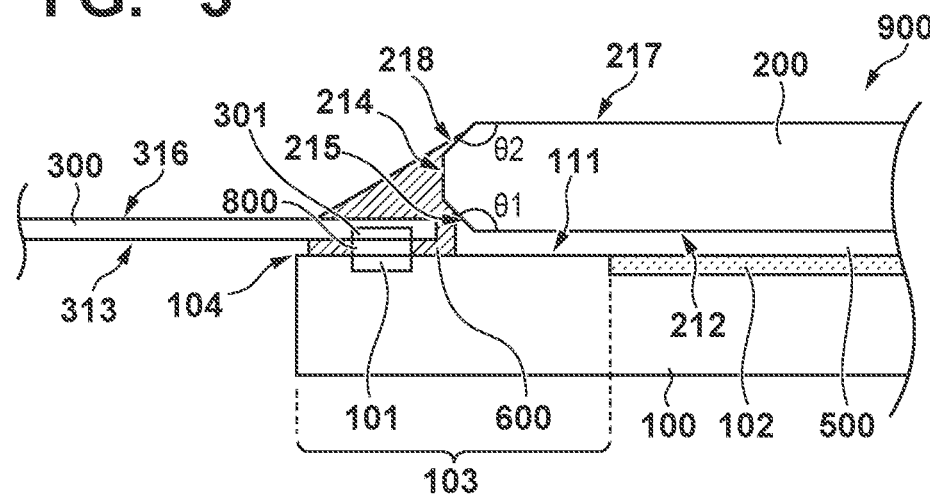
FIG. 3 is a sectional view showing a modification of the semiconductor device shown in FIGS. 1A and 1B.

FIG. 3 is a view showing a modification of the semiconductor device 900 shown in FIG. 2. In an arrangement shown in FIG. 3, the coupling member 500 contacts part of the surface 215 of the light-transmissive substrate 200, and the reinforcing member 600 further contacts a portion, not covered with the coupling member 500, of the surface 215 of the light-transmissive substrate 200, similar to the arrangement shown in FIG. 1B. Therefore, similar to the arrangement shown in FIG. 1B, even if the filling amount of the coupling member 500 is small and the coupling member 500 contacts only part of the surface 215 of the light-transmissive substrate 200, the bonding strength with respect to the light-transmissive substrate 200 can be improved. In the arrangement shown in FIG. 3 as well, it is possible to increase the bonding strength among the element substrate 100, the light-transmissive substrate 200, and the wiring board 300, and reduce the size of the semiconductor device 900.

In the arrangement shown in FIG. 3, the reinforcing member 600 contacts each of the coupling member 500 and the bonding member 800. When the reinforcing member 600 continuously covers the wiring board 300, the bonding member 800, the element substrate 100, the coupling member 500, and the light-transmissive substrate 200, the bonding strength among the element substrate 100, the light-transmissive substrate 200, and the wiring board 300 can be increased. However, the present invention is not limited to this, and the reinforcing member 600 need not contact the coupling member 500 or the bonding member 800.

FIG. 4 is a view showing a modification of the semiconductor device 900 shown in FIG. 3. In an arrangement shown in FIG. 4, an outer edge 227 of the surface 217 of the light-transmissive substrate 200 is arranged outside an outer edge 222 of the surface 212 in orthogonal projection to the surface 111 of the element substrate 100. In this arrangement, for example, in an inspection step when coupling the element substrate 100 and the light-transmissive substrate 200, biting of a foreign substance in the surface 215 of the light-transmissive substrate 200 is readily found. For example, the filling state of the coupling member 500 with respect to the surfaces 212 and 215 of the light-transmissive substrate 200 can be readily inspected from the side of the surface 217 of the light-transmissive substrate 200. Therefore, it is possible to improve the reliability of the semiconductor device 900.

In each of the above-described arrangements shown in FIGS. 1A and 1B to 4, the surfaces 215 and 218 of the light-transmissive substrate 200 are arranged not to overlap the element region 102 in orthogonal projection to the surface 111 of the element substrate 100. This is done to prevent a characteristic from changing due to chamfering of the outer edge of the light-transmissive substrate 200 in the outer edge portion of the element region 102.

The semiconductor device 900 further includes a transmissive member 700, and a frame member 400 arranged between the transmissive member 700 and the surface 217 of the light-transmissive substrate 200 to surround the outer edge portion of the surface 217, and can be provided as a module. FIGS. 5A to 5C show an example of an arrangement when the transmissive member 700 and the frame member 400 are attached to the semiconductor device 900. The frame member 400 includes a contact portion 403 contacting the surface 217 of the light-transmissive substrate 200. FIG. 5A shows a plan view that pays attention to the contact portion 403 of the frame member 400, FIG. 5B shows a sectional view of the semiconductor device 900 to which the transmissive member 700 and the frame member 400 are attached, and FIG. 5C shows a sectional view taken along a line B-B' in FIG. 5A. In the semiconductor device 900, an arrangement including the element substrate 100, the light-transmissive substrate 200, the wiring board 300, the coupling member 500, and the reinforcing member 600 which have been described above with reference to FIGS. 1A and 1B to 4 will sometimes be referred to as a structure 910, as shown in FIGS. 5B and 5C.

The frame member 400 can be formed by a material such as modified polyphenylene ether (PPE), liquid crystal polymer (LCP), or polyamide. To protect the structure 910 from the outside, the frame member 400 includes an inner wall to surround the structure 910. The frame member 400 is provided with an opening portion 404 according to the element region 102.

If the optical element arranged in the element region 102 includes a photoelectric conversion element, the transmissive member 700 can be a transmissive member made of glass, epoxy resin, or acrylic resin that transmits light to which the photoelectric conversion element has sensitivity. Alternatively, if the optical element arranged in the element region 102 includes a light emitting element, the transmissive member 700 can be a transmissive member made of glass, epoxy resin, or acrylic resin that transmits light emitted by the light emitting element. The transmissive member 700 has the role of suppressing entering of particles from the outside of the semiconductor device 900 in cooperation with the frame member 400. The transmissive member 700 is fixed to the frame member 400.

The structure of the contact portion 403 of the frame member 400 will be described next with reference to FIGS. 5A to 5C. As shown in FIGS. 5A and 5B, the contact portion 403 having a convex shape is provided over the whole circumference of the frame member 400 outside the opening portion 404 provided in the frame member 400. The contact portion 403 contacts the surface 217 of the light-transmissive substrate 200. The contact portion 403 includes an outer edge 401 and an inner edge 402 arranged between the outer edge 401 and the opening portion 404 in orthogonal projection to the surface 111 of the element substrate 100. The outer edge 401 of the contact portion 403 is arranged to overlap the outer edge 227 of the surface 217 of the light-transmissive substrate 200 or arranged inside the outer edge 227 of the surface 217 in orthogonal projection to the surface 111 of the element substrate 100. If the contact portion 403 has a convex shape, the contact area of the frame member 400 with the light-transmissive substrate 200 can be decreased, and it is possible to accurately manufacture the mold of the frame member 400. Therefore, it is possible to accurately mount the frame member 400 on the structure 910.

Furthermore, as shown in FIG. 5C, since the outer edge 401 of the contact portion 403 is arranged to overlap the outer edge 227 of the surface 217 of the light-transmissive substrate 200 or arranged inside the outer edge 227 of the surface 217, the reinforcing member 600 can contact the surface 218 of the light-transmissive substrate 200. Therefore, as described above, it is possible to increase the bonding strength among the element substrate 100, the light-transmissive substrate 200, and the wiring board 300. The length from the outer edge 401 of the contact portion 403 of the frame member 400 to the outer edge 227 of the surface 217 of the light-transmissive substrate 200 is advantageously increased in terms of the dimensional accuracy of the parts of the light-transmissive substrate 200 and the frame member 400 and the assembling accuracy of the semiconductor device 900. However, if the length from the outer edge 401 of the contact portion 403 of the frame member 400 to the outer edge 227 of the surface 217 of the light-transmissive substrate 200 is increased, the size of the semiconductor device 900 is increased. Therefore, depending on the size of the element region 102 of the element substrate 100, the length from the outer edge 401 of the contact portion 403 of the frame member 400 to the outer edge 227 of the surface 217 of the light-transmissive substrate 200 may fall within the range of 0.0 mm to 1.0 mm.

As shown in FIG. 1B, even if the outer edge portion of the surface 217 of the light-transmissive substrate 200 is not chamfered, the above-described frame member 400 and transmissive member 700 can be arranged on the surface 217 of the light-transmissive substrate 200. In this case as well, the outer edge 401 of the contact portion 403 of the frame member 400 can be arranged to overlap the outer edge 227 of the surface 217 of the light-transmissive substrate 200 or arranged inside the outer edge 227 of the surface 217.

As described above, the outer edge 401 of the contact portion 403 of the frame member 400 is arranged at the same position as that of the outer edge 227 of the surface 217 of the light-transmissive substrate 200 or arranged inside the outer edge 227. This prevents the reinforcing member 600 from being arranged between the light-transmissive substrate 200 and the contact portion 403. This improves the position accuracy when mounting the frame member 400 on the structure 910. As a result, when mounting the frame member 400 and the transmissive member 700 on the structure 910, a decrease in a yield of the semiconductor device 900 such as inclination of the frame member 400 or the transmissive member 700 from a predetermined angle caused by the reinforcing member 600 is suppressed.

The individual terms described in this specification are merely used for the purpose of explaining the present invention, and the present invention is not limited to the strict meanings of the terms and can also incorporate their equivalents.

The above-described embodiments are merely specific examples of implementing the present invention, and the interpretation of the technical scope of the present invention should not be limited to them. That is, the present invention can be implemented in various forms without departing from its technical spirit or its main features.

Application examples in which the semiconductor device 900 of this embodiment in which a light emitting element such as an organic EL (electroluminescence) element is arranged as the optical element arranged in the element region 102 and which functions as the light emitting device is applied to a display device, a photoelectric conversion device, an electronic apparatus, an illumination device, a moving body, and a wearable device will be described here with reference to FIGS. 6 to 12A and 12B. Details of the components of the above-described semiconductor device 900 functioning as the light emitting device and modifications will be described first, and the application examples will be described after that. Each optical element arranged in the element region 102 can also be referred to as a pixel.

Arrangement of Organic Light Emitting Element

The organic light emitting element is provided by forming an insulating layer, a first electrode, an organic compound layer, and a second electrode on a substrate. A protection layer, a color filter, a microlens, and the like may be provided on a cathode. If a color filter is provided, a planarizing layer can be provided between the protection layer and the color filter. The planarizing layer can be made of acrylic resin or the like. The same applies to a case in which a planarizing layer is provided between the color filter and the microlens.

Substrate

Quartz, glass, a silicon wafer, a resin, a metal, or the like may be used as a substrate. Furthermore, a switching element such as a transistor and a wiring may be provided on the substrate, and an insulating layer may be provided thereon. The insulating layer may be made of any material as long as a contact hole can be formed so that the wiring can be formed between the insulating layer and the first electrode and insulation from the unconnected wiring can be ensured. For example, a resin such as polyimide, silicon oxide, silicon nitride, or the like can be used.

Electrode

A pair of electrodes can be used as the electrodes. The pair of electrodes can be an anode and a cathode. If an electric field is applied in the direction in which the organic light emitting element emits light, the electrode having a high potential is the anode, and the other is the cathode. It can also be said that the electrode that supplies holes to the light emitting layer is the anode and the electrode that supplies electrons is the cathode.

As the constituent material of the anode, a material having a work function as large as possible may be used. For example, a metal such as gold, platinum, silver, copper, nickel, palladium, cobalt, selenium, vanadium, or tungsten, a mixture containing some of them, an alloy obtained by combining some of them, or a metal oxide such as tin oxide, zinc oxide, indium oxide, indium tin oxide (ITO), or zinc indium oxide can be used. Furthermore, a conductive polymer such as polyaniline, polypyrrole, or polythiophene can also be used.

One of these electrode materials may be used singly, or two or more of them may be used in combination. The anode may be formed by a single layer or a plurality of layers.

If the anode is used as a reflective electrode, for example, chromium, aluminum, silver, titanium, tungsten, molybdenum, an alloy thereof, a stacked layer thereof, or the like can be used. The above materials can function as a reflective film having no role as an electrode. If the anode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function may be used. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multi-layer structure. Among others, silver is suitable for use. To suppress aggregation of silver, a silver alloy is more suitable for use. The ratio of the alloy is not limited as long as aggregation of silver can be suppressed. For example, the ratio between silver and another metal may be 1:1, 3:1, or the like.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but direct current sputtering or alternating current sputtering is suitable since the good film coverage is provided and the resistance is easily lowered.

Organic Compound Layer

The organic compound layer may be formed by a single layer or a plurality of layers. If the organic compound layer includes a plurality of layers, the layers can be called a hole injection layer, a hole transport layer, an electron blocking layer, a light emitting layer, a hole blocking layer, an electron transport layer, and an electron injection layer in accordance with the functions of the layers. The organic compound layer is mainly formed from an organic compound but may contain inorganic atoms and an inorganic compound. For example, the organic compound layer may contain copper, lithium, magnesium, aluminum, iridium, platinum, molybdenum, zinc, or the like. The organic compound layer can be arranged between the first and second electrodes, and may be arranged in contact with the first and second electrodes.

Protection Layer

A protection layer may be provided on the cathode. For example, by adhering glass provided with a moisture absorbing agent on the cathode, permeation of water or the like into the organic compound layer can be suppressed and occurrence of display defects can be suppressed. Furthermore, as another embodiment, a passivation film made of silicon nitride or the like may be provided on the cathode to suppress permeation of water or the like into the organic compound layer. For example, the protection layer can be formed by forming the cathode, transferring it to another chamber without breaking the vacuum, and forming a silicon nitride film having a thickness of 2 μm by a CVD method. The protection layer may be provided using an atomic deposition method (ALD method) after forming a film using the CVD method. The material of the film by the ALD method is not limited but can be silicon nitride, silicon oxide, aluminum oxide, or the like. A silicon nitride film may further be formed by the CVD method on the film formed by the ALD method. The film formed by the ALD method may have a film thickness smaller than that of the film formed by the CVD method. More specifically, the film thickness of the film formed by the ALD method may be 50% or less, or 10% or less.

Color Filter

A color filter may be provided on the protection layer. For example, a color filter considering the size of the organic light emitting element may be provided on another substrate, and this substrate may be bonded to the substrate with the organic light emitting element provided thereon. Alternatively, a color filter may be patterned on the above-described protection layer using a photolithography technique. The color filter can be formed from a polymeric material.

Planarizing Layer

A planarizing layer may be provided between the color filter and the protection layer. The planarizing layer is provided to reduce unevenness of the lower layer. The planarizing layer may be called a material resin layer without limiting the purpose of the layer. The planarizing layer can be formed from an organic compound, and can be made of a low-molecular material or a polymeric material. However, a polymetric material is more suitable.

The planarizing layers may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, and urea resin.

Microlens

The organic light emitting device can include an optical member such as a microlens on the light emission side. The microlens can be made of acrylic resin, epoxy resin, or the like. The microlens can aim to increase the amount of light extracted from the organic light emitting device and control the direction of light to be extracted. The microlens can have a hemispherical shape. If the microlens has a hemispherical shape, among tangents contacting the hemisphere, there is a tangent parallel to the insulating layer, and the contact between the tangent and the hemisphere is the vertex of the microlens. The vertex of the microlens can be decided in the same manner even in an arbitrary sectional view. That is, among tangents contacting the semicircular of the microlens in a sectional view, there is a tangent parallel to the insulating layer, and the contact between the tangent and the semicircle is the vertex of the microlens.

Furthermore, the middle point of the microlens can also be defined. In the section of the microlens, a line segment from a point at which an arc shape ends to a point at which another arc shape ends is assumed, and the middle point of the line segment can be called the middle point of the microlens. A section for determining the vertex and the middle point may be a section perpendicular to the insulating layer.

Counter Substrate

A counter substrate can be provided on the planarizing layer. The counter substrate is called a counter substrate because it is provided at a position corresponding to the above-described substrate. The constituent material of the counter substrate can be the same as that of the above-described substrate. If the above-described substrate is the first substrate, the counter substrate can be the second substrate.

Organic Layer

The organic compound layer (hole injection layer, hole transport layer, electron blocking layer, light emitting layer, hole blocking layer, electron transport layer, electron injection layer, and the like) forming the organic light emitting element according to an embodiment of the present invention is formed by the method to be described below.

The organic compound layer forming the organic light emitting element according to the embodiment of the present invention can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

Pixel Circuit

The light emitting device can include a pixel circuit connected to the light emitting element. The pixel circuit may be an active matrix circuit that individually controls light emission of the first and second light emitting elements. The active matrix circuit may be a voltage or current programing circuit. A driving circuit includes a pixel circuit for each pixel. The pixel circuit can include a light emitting element, a transistor for controlling light emission luminance of the light emitting element, a transistor for controlling a light emission timing, a capacitor for holding the gate voltage of the transistor for controlling the light emission luminance, and a transistor for connection to GND without intervention of the light emitting element.

The light emitting device includes a display region and a peripheral region arranged around the display region. The light emitting device includes the pixel circuit in the display region and a display control circuit in the peripheral region. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light emitting element such as the first light emitting element.

Pixel

The organic light emitting device includes a plurality of pixels. Each pixel includes sub-pixels that emit light components of different colors. The sub-pixels include, for example, R, G, and B emission colors, respectively.

In each pixel, a region also called a pixel opening emits light. This region is the same as the first region. The pixel opening can have a size of 5 μm (inclusive) to 15 μm (inclusive). More specifically, the pixel opening can have a size of 11 μm, 9.5 μm, 7.4 μm, 6.4 μm, or the like.

A distance between the sub-pixels can be 10 μm or less, and can be, more specifically, 8 μm, 7.4 μm, or 6.4 μm.

The pixels can have a known arrangement form in a plan view. For example, the pixels may have a stripe arrangement, a delta arrangement, a pentile arrangement, or a Bayer arrangement. The shape of each sub-pixel in a plan view may be any known shape. For example, a quadrangle such as a rectangle or a rhombus, a hexagon, or the like may be possible. A shape which is not a correct shape but is close to a rectangle is included in a rectangle, as a matter of course. The shape of the sub-pixel and the pixel arrangement can be used in combination.

Application of Organic Light Emitting Element of Embodiment of Present Invention The organic light emitting element according to an embodiment of the present invention can be used as a constituent member of a display device or an illumination device. In addition, the organic light emitting element is applicable to the exposure light source of an electrophotographic image forming device, the backlight of a liquid crystal display device, a light emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer can have a touch panel function. The driving type of the touch panel function may be an infrared type, a capacitance type, a resistive film type, or an electromagnetic induction type, and is not particularly limited. The display device may be used for the display unit of a multifunction printer.

Details will be described below with reference to FIGS. 6 to 12A and 12B.

FIG. 6 is a schematic view showing an example of the display device using the semiconductor device 900 functioning as the light emitting device of this embodiment. A display device 1000 can include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Active elements such as transistors are arranged on the circuit board 1007. The battery 1008 is unnecessary if the display device 1000 is not a portable apparatus. Even when the display device 1000 is a portable apparatus, the battery 1008 need not be provided at this position. The semiconductor device 900 can be applied to the display panel 1005. The element region 102 of the semiconductor device 900 functioning as the display panel 1005 is connected to the active elements such as transistors arranged on the circuit board 1007 and operates.

The display device 1000 shown in FIG. 6 can be used for a display unit of a photoelectric conversion device (image capturing device) including an optical unit having a plurality of lenses, and an image sensor for receiving light having passed through the optical unit and photoelectrically converting the light into an electric signal. The photoelectric conversion device can include a display unit for displaying information acquired by the image sensor. In addition, the display unit can be either a display unit exposed outside the photoelectric conversion device, or a display unit arranged in the finder. The photoelectric conversion device can be a digital camera or a digital video camera.

FIG. 7 is a schematic view showing an example of the photoelectric conversion device using the semiconductor device 900 functioning as the light emitting device of this embodiment. A photoelectric conversion device 1100 can include a viewfinder 1101, a rear display 1102, an operation unit 1103, and a housing 1104. The photoelectric conversion device 1100 can also be called an image capturing device. The semiconductor device 900 according to this embodiment can be applied to the viewfinder 1101 or the rear display 1102 as a display unit. In this case, the element region 102 of the semiconductor device 900 can display not only an image to be captured but also environment information, image capturing instructions, and the like. Examples of the environment information are the intensity and direction of external light, the moving velocity of an object, and the possibility that an object is covered with an obstacle.

The timing suitable for image capturing is a very short time in many cases, so the information should be displayed as soon as possible. Therefore, the semiconductor device 900 functioning as the light emitting device in which the organic light emitting material such as an organic EL element is included in the optical element arranged in the element region 102 may be used for the viewfinder 1101 or the rear display 1102. This is so because the organic light emitting material has a high response speed. The semiconductor device 900 functioning as the light emitting device using the organic light emitting material can be used for the apparatuses that require a high display speed more suitably than for the liquid crystal display device.

The photoelectric conversion device 1100 includes an optical unit (not shown). This optical unit has a plurality of lenses, and forms an image on a photoelectric conversion element (not shown) that receives light having passed through the optical unit and is accommodated in the housing 1104. The focal points of the plurality of lenses can be adjusted by adjusting the relative positions. This operation can also automatically be performed.

The semiconductor device 900 functioning as the light emitting device may be applied to a display unit of an electronic apparatus. At this time, the display unit can have both a display function and an operation function. Examples of the portable terminal are a portable phone such as a smartphone, a tablet, and a head mounted display.

FIG. 8 is a schematic view showing an example of an electronic apparatus using the semiconductor device 900 functioning as the light emitting device of this embodiment. An electronic apparatus 1200 includes a display unit 1201, an operation unit 1202, and a housing 1203. The housing 1203 can accommodate a circuit, a printed board having this circuit, a battery, and a communication unit. The operation unit 1202 can be a button or a touch-panel-type reaction unit. The operation unit 1202 can also be a biometric authentication unit that performs unlocking or the like by authenticating the fingerprint. The portable apparatus including the communication unit can also be regarded as a communication apparatus. The semiconductor device 900 according to this embodiment can be applied to the display unit 1201.

Figure 9A:
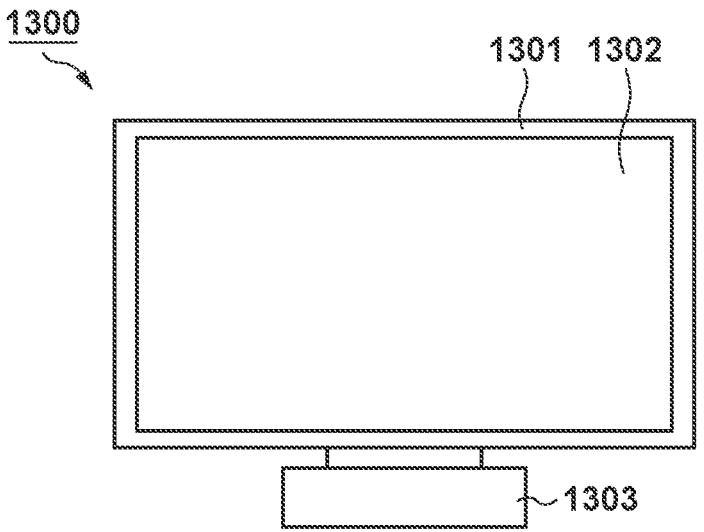
FIGS. 9A and 9B are views each showing an example of a display device using the semiconductor device according to the embodiment.
Figure 9B:
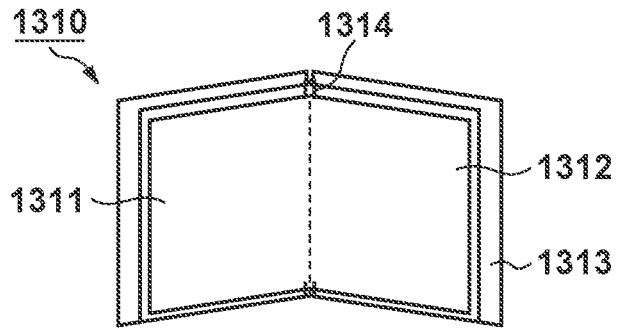

FIGS. 9A and 9B are schematic views showing examples of the display device using the semiconductor device 900 functioning as the light emitting device of this embodiment. FIG. 9A shows a display device such as a television monitor or a PC monitor. A display device 1300 includes a frame 1301 and a display unit 1302. The semiconductor device 900 according to this embodiment can be applied to the display unit 1302. The display device 1300 can include a base 1303 that supports the frame 1301 and the display unit 1302. The base 1303 is not limited to the form shown in FIG. 9A. For example, the lower side of the frame 1301 may also function as the base 1303. In addition, the frame 1301 and the display unit 1302 can be bent. The radius of curvature in this case can be 5,000 mm (inclusive) to 6,000 mm (inclusive).

FIG. 9B is a schematic view showing another example of the display device using the semiconductor device 900 functioning as the light emitting device of this embodiment. A display device 1310 shown in FIG. 9B can be folded, and is a so-called foldable display device. The display device 1310 includes a first display unit 1311, a second display unit 1312, a housing 1313, and a bending point 1314. The semiconductor device 900 according to this embodiment can be applied to each of the first display unit 1311 and the second display unit 1312. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

FIG. 10 is a schematic view showing an example of the illumination device using the semiconductor device 900 functioning as the light emitting device of this embodiment. An illumination device 1400 can include a housing 1401, a light source 1402, a circuit board 1403, an optical film 1404, and a light diffusing unit 1405. The semiconductor device 900 according to this embodiment can be applied to the light source 1402. The optical film 1404 can be a filter that improves the color rendering of the light source. When performing lighting-up or the like, the light diffusing unit 1405 can throw the light of the light source over a broad range by effectively diffusing the light. The illumination device can also include a cover on the outermost portion, as needed. The illumination device 1400 can include both or one of the optical film 1404 and the light diffusing unit 1405.

The illumination device 1400 is, for example, a device for illuminating the interior of the room. The illumination device 1400 can emit white light, natural white light, or light of any color from blue to red. The illumination device 1400 can also include a light control circuit for controlling these light components. The illumination device 1400 can also include a power supply circuit connected to the element region 102 of the semiconductor device 900 functioning as the light source 1402. The power supply circuit is a circuit for converting an AC voltage into a DC voltage. White has a color temperature of 4,200 K, and natural white has a color temperature of 5,000 K. The illumination device 1400 may also include a color filter. In addition, the illumination device 1400 can include a heat radiation unit. The heat radiation unit radiates the internal heat of the device to the outside of the device, and examples are a metal having a high specific heat and liquid silicon.

FIG. 11 is a schematic view of an automobile having a taillight as an example of a vehicle lighting appliance using the semiconductor device 900 functioning as the light emitting device of this embodiment. An automobile 1500 has a taillight 1501, and can have a form in which the taillight 1501 is turned on when performing a braking operation or the like. The semiconductor device 900 of this embodiment can be used as a headlight serving as a vehicle lighting appliance. The automobile is an example of a moving body, and the moving body may be a ship, a drone, an aircraft, a railroad car, an industrial robot, or the like. The moving body may include a main body and a lighting appliance provided in the main body. The lighting appliance may be used to make a notification of the current position of the main body.

The semiconductor device 900 functioning as the light emitting device according to this embodiment can be applied to the taillight 1501. The taillight 1501 can include a protection member for protecting the element region 102 of the semiconductor device 900 functioning as the taillight 1501. The material of the protection member is not limited as long as the material is a transparent material with a strength that is high to some extent, and an example is polycarbonate. The protection member may be made of a material obtained by mixing a furandicarboxylic acid derivative, an acrylonitrile derivative, or the like in polycarbonate.

The automobile 1500 can include a vehicle body 1503, and a window 1502 attached to the vehicle body 1503. This window can be a window for checking the front and back of the automobile, and can also be a transparent display. For this transparent display, the semiconductor device 900 functioning as the light emitting device according to this embodiment may be used. In this case, the constituent materials of the electrodes and the like of the semiconductor device 900 are formed by transparent members.

Further application examples of the semiconductor device 900 functioning as the light emitting device according to this embodiment will be described with reference to FIGS. 12A and 12B. The semiconductor device 900 functioning as the light emitting device can be applied to a system that can be worn as a wearable device such as smartglasses, a Head Mounted Display (HMD), or a smart contact lens. An image capturing display device used for such application examples includes an image capturing device capable of photoelectrically converting visible light and a light emitting device capable of emitting visible light.

Glasses 1600 (smartglasses) according to one application example will be described with reference to FIG. 12A. An image capturing device 1602 such as a CMOS sensor or an SPAD is provided on the surface side of a lens 1601 of the glasses 1600. In addition, the semiconductor device 900 functioning as the light emitting device according to this embodiment is provided on the back surface side of the lens 1601.

The glasses 1600 further include a control device 1603. The control device 1603 functions as a power supply that supplies electric power to the image capturing device 1602 and the semiconductor device 900 according to each embodiment. In addition, the control device 1603 controls the operations of the image capturing device 1602 and the semiconductor device 900. An optical system configured to condense light to the image capturing device 1602 is formed on the lens 1601.

Glasses 1610 (smartglasses) according to one application example will be described with reference to FIG. 12B. The glasses 1610 include a control device 1612, and an image capturing device corresponding to the image capturing device 1602 and the semiconductor device 900 functioning as the light emitting device are mounted on the control device 1612. The image capturing device in the control device 1612 and an optical system configured to project light emitted from the semiconductor device 900 are formed in a lens 1611, and an image is projected to the lens 1611. The control device 1612 functions as a power supply that supplies electric power to the image capturing device and the semiconductor device 900, and controls the operations of the image capturing device and the semiconductor device 900. The control device 1612 may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The semiconductor device 900 functioning as the light emitting device according to the embodiment of the present invention can include an image capturing device including a light receiving element, and control a displayed image based on the line-of-sight information of the user from the image capturing device.

More specifically, the semiconductor device 900 decides a first visual field region at which the user is gazing and a second visual field region other than the first visual field region based on the line-of-sight information. The first visual field region and the second visual field region may be decided by the control device of the semiconductor device 900, or those decided by an external control device may be received. In the display region of the semiconductor device 900, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the semiconductor device 900, or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the semiconductor device 900, the image capturing device, or an external device. If the external device holds the AI program, it is transmitted to the semiconductor device 900 via communication.

When performing display control based on line-of-sight detection, smartglasses further including an image capturing device configured to capture the outside can be applied. The smartglasses can display captured outside information in real time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-072670, filed Apr. 26, 2022, which is hereby incorporated by reference herein in its entirety.

What is claimed is:

1. A light emitting device comprising:

an element substrate having a first surface on which are provided (1) an element region where an optical element including a light emitting element is arranged and (2) a peripheral region where an external connection terminal is arranged;

a light-transmissive substrate having a second surface that is coupled to the first surface via a coupling member so as to cover the element region;

a wiring board having a third surface on which an electrode connected to the external connection terminal is provided; and a reinforcing member configured to reinforce bonding strength between the element substrate and the wiring board, wherein the external connection terminal is arranged along a first side of the first surface, wherein a side surface, orthogonal to the second surface, of the light-transmissive substrate includes a fourth surface arranged along the first side, wherein a fifth surface chamfered so that an angle with respect to the second surface becomes an obtuse angle is arranged between the second surface and the fourth surface, wherein the coupling member contacts the fifth surface, and wherein the reinforcing member contacts a sixth surface of the wiring board on an opposite side of the third surface, the peripheral region, and the fourth surface.

2. The device according to claim 1, wherein the coupling member contacts part of the fifth surface, and wherein the reinforcing member further contacts a portion of the fifth surface, which is not covered with the coupling member.

3. The device according to claim 2, wherein the reinforcing member contacts the coupling member.

4. The device according to claim 1, wherein the light-transmissive substrate has a seventh surface on an opposite side of the second surface, wherein a transmissive member, and a frame member arranged between the transmissive member and the seventh surface to surround an outer edge portion of the seventh surface are further included in the device, wherein the frame member includes a contact portion contacting the seventh surface, and wherein an outer edge of the contact portion is arranged to overlap the outer edge of the seventh surface or arranged inside the outer edge of the seventh surface in orthogonal projection to the first surface.

5. The device according to claim 1, wherein the light-transmissive substrate has a seventh surface on an opposite side of the second surface, wherein an eighth surface chamfered so that an angle with respect to the seventh surface becomes an obtuse angle is arranged between the fourth surface and the seventh surface, and wherein the reinforcing member further contacts the eighth surface.

6. The device according to claim 5, wherein an outer edge of the seventh surface is arranged outside an outer edge of the second surface in orthogonal projection to the first surface.

7. The device according to claim 5, wherein the outer edge of each of the second surface and the seventh surface is chamfered over a whole circumference.

8. The device according to claim 5, wherein the fifth surface and the eighth surface do not overlap the element region in orthogonal projection to the first surface.

9. The device according to claim 5, wherein the reinforcing member contacts the coupling member.

10. The device according to claim 5, further comprising a transmissive member, and a frame member arranged between the transmissive member and the seventh surface to surround an outer edge portion of the seventh surface, wherein the frame member includes a contact portion contacting the seventh surface, and wherein an outer edge of the contact portion is arranged to overlap the outer edge of the seventh surface or is arranged inside the outer edge of the seventh surface in orthogonal projection to the first surface.

11. The device according to claim 2, wherein the light-transmissive substrate has a seventh surface on an opposite side of the second surface, wherein an eighth surface chamfered so that an angle with respect to the seventh surface becomes an obtuse angle is arranged between the fourth surface and the seventh surface, and wherein the reinforcing member further contacts the eighth surface.

12. The device according to claim 11, wherein an outer edge of the seventh surface is arranged outside an outer edge of the second surface in orthogonal projection to the first surface.

13. The device according to claim 11, wherein the outer edge of each of the second surface and the seventh surface is chamfered over a whole circumference.

14. The device according to claim 11, wherein the fifth surface and the eighth surface do not overlap the element region in orthogonal projection to the first surface.

15. The device according to claim 11, wherein the reinforcing member contacts the coupling member.

16. The device according to claim 11, further comprising a transmissive member, and a frame member arranged between the transmissive member and the seventh surface to surround an outer edge portion of the seventh surface, wherein the frame member includes a contact portion contacting the seventh surface, and wherein an outer edge of the contact portion is arranged to overlap the outer edge of the seventh surface or arranged inside the outer edge of the seventh surface in orthogonal projection to the first surface.

17. The device according to claim 1, wherein the external connection terminal and the electrode are connected via a bonding member, and wherein the reinforcing member contacts the bonding member.

18. A display device comprising:

the light emitting device according to claim 1; and an active element connected to the light emitting device.

19. A photoelectric conversion device comprising:

an optical unit including a plurality of lenses;

an image sensor configured to receive light having passed through the optical unit; and a display unit configured to display an image, wherein the display unit displays an image captured by the image sensor, and includes the light emitting device according to claim 1.

20. An electronic apparatus comprising:

a housing provided with a display unit; and a communication unit provided in the housing and configured to perform external communication, wherein the display unit includes the light emitting device according to claim 1.

21. An illumination device comprising:

a light source; and at least one of a light diffusing unit and an optical film, wherein the light source includes the light emitting device according to claim 1.

22. A moving body comprising:

a main body; and a lighting appliance provided in the main body, wherein the lighting appliance includes the light emitting device according to claim 1.

23. A wearable device comprising:

a display device configured to display an image, wherein the display device includes the light emitting device according to claim 1.

* * * * *